(12) United States Patent
Yildiz et al.

(10) Patent No.: US 7,573,408 B2
(45) Date of Patent: Aug. 11, 2009

(54) METHOD AND SYSTEM FOR CORRECTING SWITCHED INPUT A/D CONVERTERS

(75) Inventors: Yesna Oyku Yildiz, Boston, MA (US); Douglas Abraham, Topsfield, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 11/903,259

(22) Filed: Sep. 21, 2007

(65) Prior Publication Data

US 2008/0150781 A1 Jun. 26, 2008
US 2009/0051578 A2 Feb. 26, 2009

Related U.S. Application Data

(60) Provisional application No. 60/846,380, filed on Sep. 21, 2006.

(51) Int. Cl.
*H03M 1/06* (2006.01)
(52) U.S. Cl. .................................. 341/118; 341/155
(58) Field of Classification Search ................. 341/139, 341/155, 144, 118, 120, 143
See application file for complete search history.

(56) References Cited

U.S. PATENT DOCUMENTS 5,698,984 A * 12/1997 Little et al. ................. 324/601
5,818,370 A * 10/1998 Sooch et al. ................ 341/120

* cited by examiner

*Primary Examiner*—Brian Young
(74) *Attorney, Agent, or Firm*—McDermott Will & Emery LLP

(57) ABSTRACT

A system is described for correcting a switched input A/D converter circuit that performs a plurality of A/D conversions. The system includes an oversampling circuit, a switched input controller, separation circuitry, and a signal processing subsystem. The oversampling circuit is configured to convert one or more input analog signals into oversampled output signals. The switched input controller is configured to switch a separate calibration signal into the oversampling circuit, as a replacement for the input analog signal, for at least some of the A/D conversions. The separation circuitry is configured to separate the oversampled output signal from the calibration signal. The signal processing subsystem is configured to synchronously and separately process the oversampled output signal and the calibration signal so as to substantially reduce unwanted correlated response of the switched input A/D converter circuit.

12 Claims, 2 Drawing Sheets

METHOD AND SYSTEM FOR CORRECTING SWITCHED INPUT A/D CONVERTERS

CROSS-REFERENCE TO RELATED APPLICATIONS

This application is based upon, and claims the benefit of priority under 35 U.S.C. § 119(e), from U.S. Provisional Patent Application Ser. No. 60/846,380 (the "'380 provisional application"), filed Sep. 21, 2006, entitled "A Method for Calibrating or Correcting Switched Input A/D Converters to Reduce Unwanted Correlated Signals Inherent Within the A/D Converter." The content of the '380 provisional application is incorporated herein by reference in its entirety as though fully set forth.

BACKGROUND

A/D (analog-to-digital) converters are circuits that convert continuous analog signals, for example an input analog voltage or current signal, into discrete digital signals. Switched input A/D converters typically include a switched input circuit that connects the A/D converter to an input power source (for example, a DC or AC voltage source), so that a DC supply voltage of selectable polarity can be provided to the A/D converter.

A number of unwanted correlated signals are inherent in switched input A/D converters. Examples of these inherent unwanted responses include, but are not limited to, offset stability, gain stability, gain accuracy, offset drift and gain drift.

Methods and systems are desired for correcting these unwanted correlated signals in switched input A/D converters, while maintaining an improved overall response.

SUMMARY

A system is described for correcting a switched input A/D converter circuit that performs a plurality of A/D conversions. The system includes an oversampling circuit, a switched input controller, separation circuitry, and a signal processing subsystem. The oversampling circuit is configured to convert one or more input analog signals into oversampled output signals. The switched input controller is configured to switch a separate calibration signal into the oversampling circuit, as a replacement for the input analog signal, for at least some of the A/D conversions. The separation circuitry is configured to separate the oversampled output signal from the calibration signal. The signal processing subsystem is configured to synchronously and separately process the oversampled output signal and the calibration signal so as to substantially reduce unwanted correlated response of the switched input A/D converter circuit.

DETAILED DESCRIPTION

In the present disclosure, methods and systems are described for correcting unwanted correlated signals, such as offset stability, gain stability, gain accuracy, offset drift, and gain drift, in switched input A/D converters.

Figure 1:
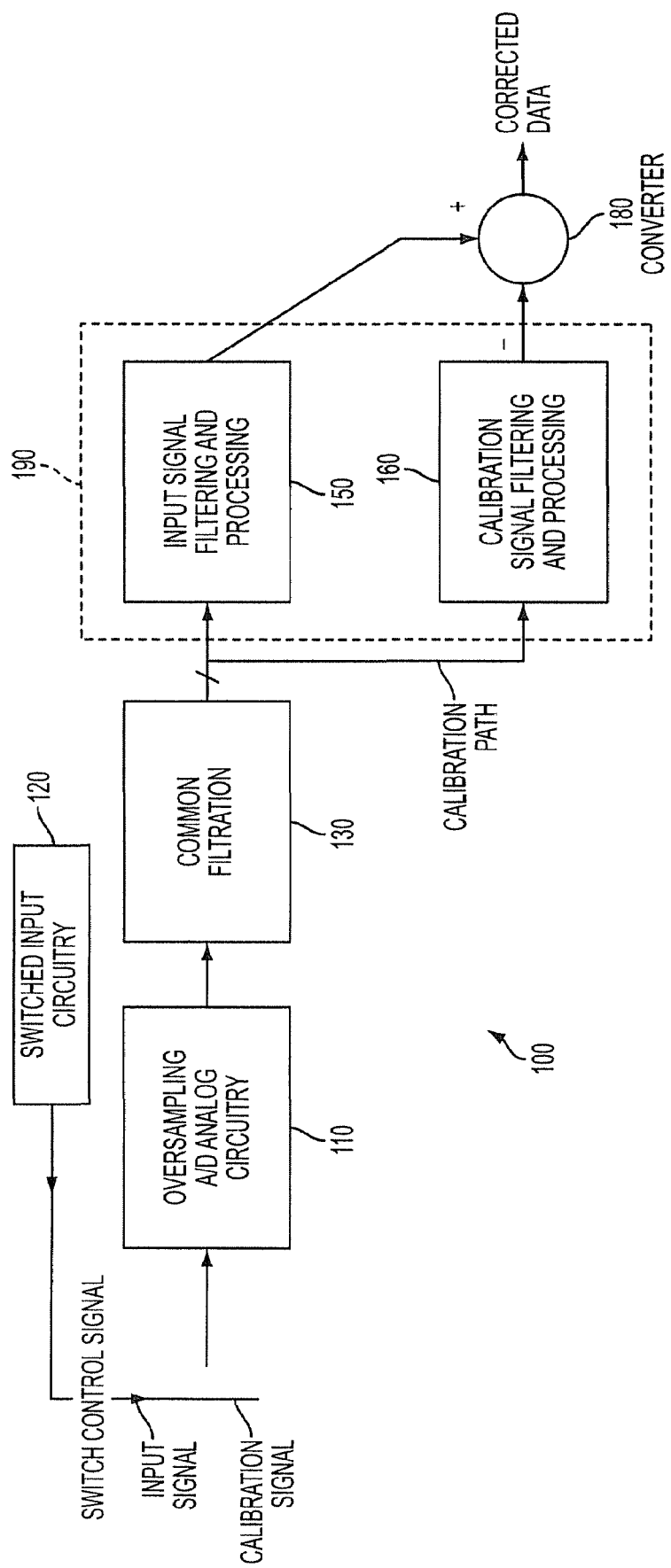
FIG. 1 is a schematic block diagram of a system 100 for correcting for unwanted correlated signals in switched input A/D converters, in accordance with one embodiment of the present disclosure.

FIG. 1 is a schematic block diagram of a system 100 for correcting for unwanted correlated signals in switched input A/D converters, in accordance with one embodiment of the present disclosure. In overview, the system 100 includes an oversampling circuit 110, a switched input circuit 120, a signal separation circuit 130, and a signal processing subsystem 190. The oversampling circuit 110 is configured to convert one or more input analog signals into oversampled output signals. The oversampling circuit 110 may be a conventional circuit samples the input signal and/or the calibration signal at a sampling rate that is much higher than the Nyquist frequency. The switched input circuit 120 is configured to switch, for at least some of the A/D conversions, a separate calibration signal into the oversampling circuit 110, as a replacement for the input analog signal. In other words, for at least some of the oversampled conversions, the analog input signal is not switched to the converter by the switched input circuit 120, but rather another different signal, namely the calibration signal, is switched to the A/D converter through the oversampling circuit 110.

After the oversampling step, the two different types of conversions, mainly input and calibration, are then separated and synchronously manipulated, to reduced unwanted correlated inherent responses of the A/D converter.

The signal separation circuit 130 may be configured to perform common filtering of the oversampled output signal and the oversampled calibration signal. After the common filtering process, the circuit sends the filtered and oversampled signals onto different portions of the signal processing subsystem 190.

The signal processing subsystem 190 is configured to synchronously and independently process the oversampled output signal and the oversampled calibration signal, so as to substantially reduce unwanted correlated response when A/D conversion is performed on the oversampled signals. The synchronous manipulation of the converted data may include one or more of: filtration, compensation, restoration, interpolation, and scaling. Examples of unwanted correlated signals or responses that are inherent in A/D conversion of switched input A/D converters include one or more of the following: offset stability; gain stability; gain accuracy; offset drift; and gain drift.

The signal processing subsystem 190 includes a first processing circuit 150 and a second processing circuit 160. The first processing circuit 150 is configured to filter and process the oversampled input signal. The second processing circuit 160 is configured to filter and process the oversampled calibration signal. The components of each of the first processing circuit 150 and the second processing circuit 160 may include, but are not limited to, one or more of the following: a filtration circuit; a compensation circuit; a restoration circuit; and interpolation circuit; and a scaling circuit. These circuits may perform these conventional processing steps on the oversampled analog signal and the oversampled calibration signal.

The system 100 includes a converter 180, which converts the separately processed input signal and calibration signal, to generate corrected digital data.

Figure 2:
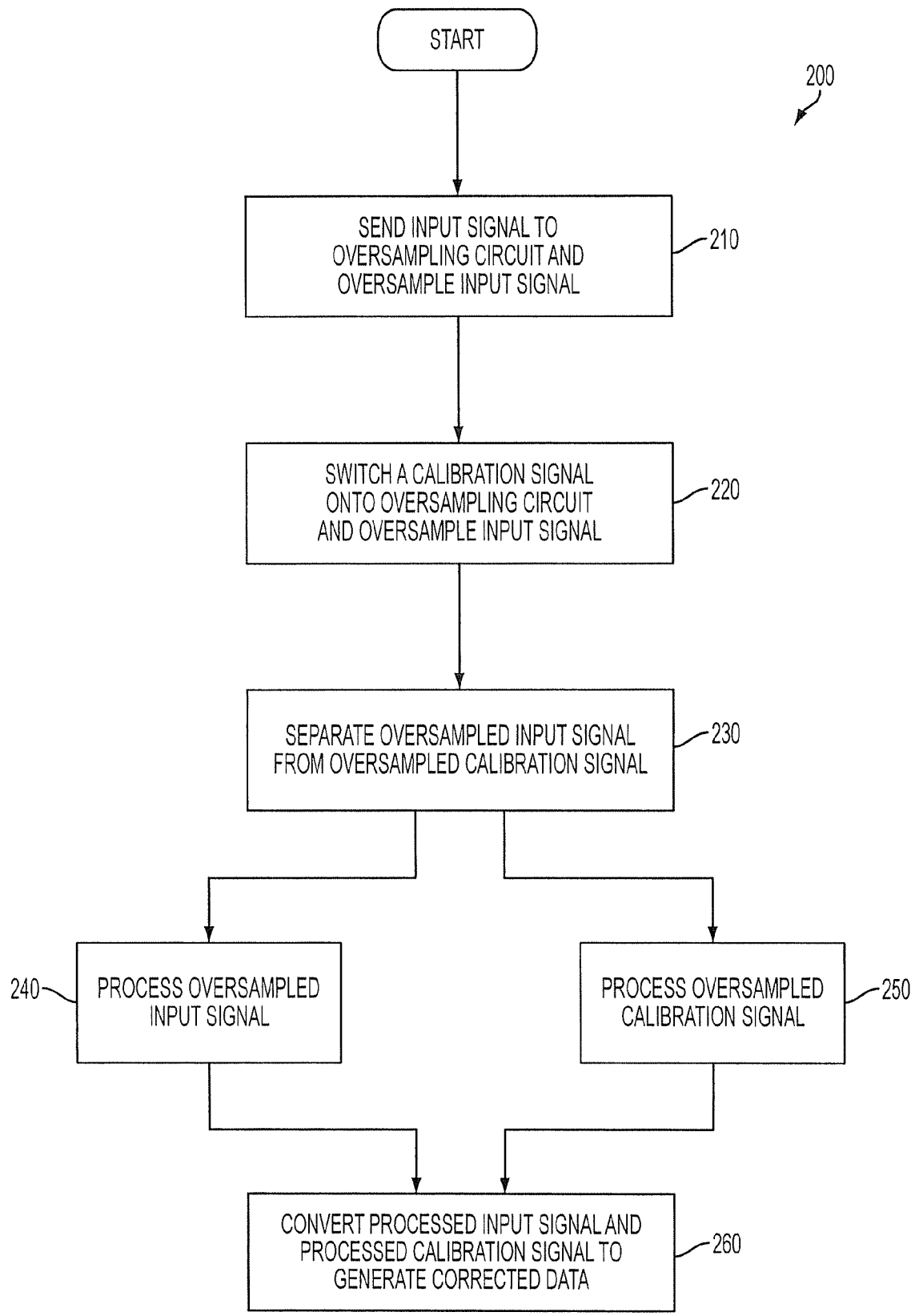
FIG. 2 is a schematic flow chart of a method of correcting for unwanted correlated signals in switched input A/D converters, in accordance with one embodiment of the present disclosure.

FIG. 2 is a schematic flow chart of a method of correcting for unwanted correlated signals in switched input A/D converters, in accordance with one embodiment of the present disclosure. In step 210, one or more input signals are send to the oversampling circuit, and the input signal is oversampled. For some of these oversampled conversions, the input signal is not switched to the converter. Instead, as shown in step 210, another calibration signal is switched to the AD converter, and the calibration signal is oversampled.

The two different types of conversions, mainly input and calibration, are then separated and synchronously manipulated to reduce the unwanted correlated inherent responses of the AD converter mentioned above. The synchronous manipulation of the converted data includes signal processing steps such as filtration, compensation, restoration, interpolation and scaling. In step 240, the oversampled input signal is processed by synchronous manipulation. In step 250, the oversampled calibration signal is separately processed by such signal processing steps.

Finally in step 260, the processed input signal and the processed calibration signal are converted, to generate corrected digital data.

The methods and systems described in the present disclosure substantially reduce unwanted correlated signals inherent in the converter, while guaranteeing a fixed output code for the no signal input condition. In this way, the need for offset correction is substantially eliminated, in systems that need to know the offset level of the A/D converter. Also, this approach guarantees a fixed output code for the full signal input condition, thus eliminating the need for full scale correction in systems that need to know the full scale level of the converter.

In sum, methods and systems have been described that correct for unwanted correlated signals that are inherent in the A/D conversions of switched input AD converters. One advantage of the approach described in the present disclosure is that a better overall response is obtained. Another advantage is that less silicon is required for the A/D converter, so that higher channel densities can be obtained for A/D chips. scale correction in systems that need to know the full scale level of the converter.

While certain embodiments have been described of methods and systems for correction of unwanted signals in switched input A/D converters, it is to be understood that the concepts implicit in these embodiments may be used in other embodiments as well. The protection of this application is limited solely to the claims that now follow.

In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited in the phrase "step for."

What is claimed is:

1. A system for correcting a switched input A/D converter that is configured to perform a plurality of A/D conversions, the system comprising:
    an oversampling circuit configured to convert one or more input analog signals into oversampled input signals;
    a switched input circuit configured to switch, for at least some of the A/D conversions, a calibration signal that is different from the input analog signals into the oversampling circuit, so that the oversampling circuit receives and oversamples the calibration signal instead of the input analog signal; and
    a signal processing subsystem configured to synchronously and independently process the oversampled input signal and the oversampled calibration signal so as to substantially reduce unwanted correlated response when A/D conversion is performed on the oversampled signals.

2. The system of claim 1, further comprising a filtering and separation circuit configured to perform common filtration on the oversampled input signal and the oversampled calibration signal, then direct the oversampled input signal and the oversampled calibration signal onto different circuits within the signal processing subsystem.

3. The system of claim 1, wherein the signal processing subsystem comprises a first processing circuit configured to receive and process the oversampled input signal, and a second processing circuit configured to receive and process the oversampled calibration signal.

4. The system of claim 1, wherein the first processing circuit and the second processing circuit each comprises at least one of:
    a filtration circuit;
    a compensation circuit;
    a restoration circuit;
    an interpolation circuit; and
    a scaling circuit.

5. The system of claim 1, wherein the unwanted correlated response of said system comprises at least one of:
    offset stability;
    gain stability;
    gain accuracy;
    offset drift; and
    gain drift.

6. A switched input A/D converter configured to perform a plurality of A/D conversions, the switched input A/D converter comprising:
    an oversampling circuit configured to convert one or more input analog signals into oversampled input signals;
    a switched input circuit configured to switch, for at least some of the A/D conversions, a separate calibration signal into the oversampling circuit, so that the oversampling circuit receives and oversamples the calibration signal instead of the input analog signal;
    a signal separation circuit configured to separate the oversampled input signal from the oversampled calibration signal;
    a signal processing subsystem configured to synchronously and independently process the oversampled input signal and the oversampled calibration signal so as to substantially reduce unwanted correlated response when A/D conversion is performed on the oversampled signals; and
    a converter configured to convert the signals processed by the signal processing subsystem to generate digital data.

7. The system of claim 6, wherein the signal processing subsystem comprises a first processing circuit configured to receive and process the oversampled input signal, and a second processing circuit configured to receive and process the oversampled calibration signal.

8. The system of claim 6, wherein the first processing circuit and the second processing circuit each comprises at least one of:
    a filtration circuit;
    a compensation circuit;
    a restoration circuit;
    an interpolation circuit; and
    a scaling circuit.

9. A method of correcting a switched input A/D converter circuit for unwanted signals, the method comprising:

oversampling an input analog signal that is input into the switched input A/D convert circuit, to generate an oversampled output signal;

switching a separate calibration signal into the oversampling circuit, instead of the input analog signal, for at least some of the plurality of A/D conversions, so that the calibration signal is oversampled;

synchronously and separately processing the oversampled output signal and the oversampled calibration signal, so as to substantially reduce unwanted correlated response when A/D conversion is performed on the processed signals; and separating the oversampled output signal from the oversampled calibration signal by sending the oversampled output signal and the oversampled calibration signal onto different processing circuits.

10. The method of claim 9, wherein the act of separating the oversampled output signal from the oversampled calibration signal comprises the acts of sending the oversampled output signal through a first circuit within a signal processing subsystem, and sending the oversampled calibration signal through a second circuit within the signal processing subsystem;

wherein the second circuit is different from the first circuit; and wherein each of the first circuit and the second circuit comprises at least one of:

a filtering circuit; a compensation circuit; a restoration circuit; an interpolation circuit; and a scaling circuit.

11. The method of claim 9, wherein the act of synchronously processing the oversampled output signal and the oversampled calibration signal comprises at least one of:

filtering the signals;
compensating for the signals;
restoring the signals;
interpolating the signals; and
scaling the signals.

12. A method of converting an input analog signal into a digital signal while substantially reducing unwanted correlated response, the method comprising:

oversampling an input analog signal that is input into the switched input A/D convert circuit, to generate an oversampled input signal;

switching a separate calibration signal into the oversampling circuit, instead of the input analog signal, and oversampling the calibration signal;

synchronously and separately processing the oversampled output signal and the oversampled calibration signal. so as to substantially reduce unwanted correlated response when A/D conversion is performed on the processed signals; and separating the oversampled input signal and the oversampled calibration signal to send each signal into different portions of a signal processing circuit.

* * * * *